US011239207B1

(12) United States Patent
Kirby

(10) Patent No.: US 11,239,207 B1
(45) Date of Patent: Feb. 1, 2022

(54) SEMICONDUCTOR DIE STACKS AND ASSOCIATED SYSTEMS AND METHODS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/938,861

(22) Filed: Jul. 24, 2020

(51) Int. Cl.
*H01L 25/065* (2006.01)
*H01L 25/18* (2006.01)
*H01L 23/00* (2006.01)
*H01L 25/00* (2006.01)

(52) U.S. Cl.
CPC .......... *H01L 25/0657* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/0651* (2013.01); *H01L 2225/06524* (2013.01); *H01L 2225/06555* (2013.01); *H01L 2924/1431* (2013.01); *H01L 2924/1434* (2013.01)

(58) Field of Classification Search
CPC ....... H01L 25/0657; H01L 2224/08145; H01L 2225/06555; H01L 24/08; H01L 24/80; H01L 2224/80895; H01L 2924/1434; H01L 2225/06524; H01L 2924/1431; H01L 25/50; H01L 25/18; H01L 2225/0651
See application file for complete search history.

(56) References Cited

U.S. PATENT DOCUMENTS

2019/0057756 A1   2/2019   Kim et al.
2020/0006268 A1*  1/2020   Takiar ............... H01L 24/94

FOREIGN PATENT DOCUMENTS

WO   2019212623 A1   11/2019

OTHER PUBLICATIONS

International Application No. PCT/US2021/041203—International Search Report and Written Opinion, dated Nov. 10, 2021, 14 pages.

* cited by examiner

*Primary Examiner* — Thanh Y. Tran
(74) *Attorney, Agent, or Firm* — Perkins Coie LLP

(57) ABSTRACT

Semiconductor die stacks, and associated methods and systems are disclosed. The semiconductor die stack may include a first die with a memory array and a second die with CMOS circuitry configured to access the memory array. The first die may not have circuitry for accessing the memory array. Further, the first and second dies may be bonded to function as a single memory device, and front surfaces of the first and second dies are conjoined to form electrical connections therebetween. The second die may include a portion uncovered by the first die, where bond pads of the semiconductor die stack are located. The first die may provide a space for bond wires to connect to the bond pads without interfering with another die attached above the semiconductor die stack. Multiple semiconductor die stacks may be stacked on top of and in line with each other.

20 Claims, 8 Drawing Sheets

SEMICONDUCTOR DIE STACKS AND ASSOCIATED SYSTEMS AND METHODS

TECHNICAL FIELD

The present disclosure generally relates to semiconductor device assemblies, and more particularly relates to semiconductor die stacks and associated systems and methods.

BACKGROUND

Semiconductor packages typically include one or more semiconductor dies (e.g., memory chips, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to form bond wires to one or more bond pads located in the portion. Such an arrangement, however, tends to increase the footprint of the semiconductor packages. In some cases, the semiconductor dies may be stacked in a zig-zag pattern to increase a space above the bond pads with respect to a semiconductor die overlying above the bond pads. Moreover, the semiconductors dies may include through-substrate vias (TSVs) to facilitate stacking of the semiconductor dies, but with an increased cost compared to wire bonding technique.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1A:
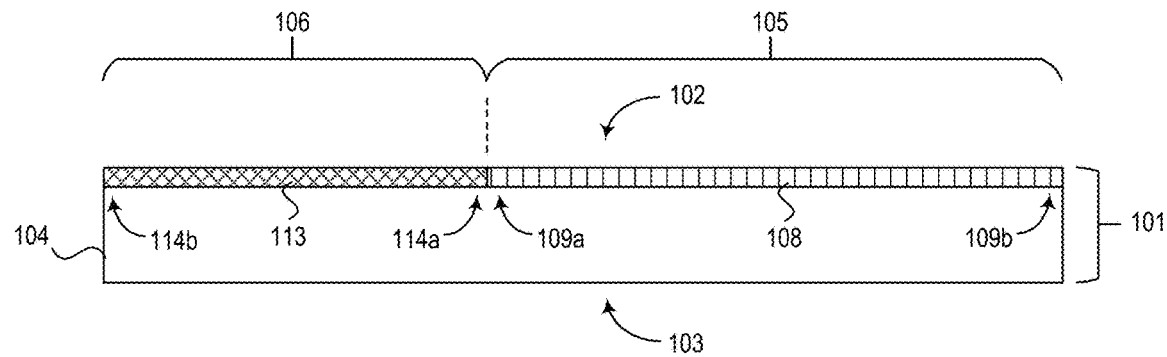
FIG. 1A is a cross-sectional diagram of a semiconductor die.

Specific details of several embodiments of semiconductor die stacks, and associated systems and methods are described below. The term "semiconductor device or die" generally refers to a solid-state device that includes one or more semiconductor materials. Examples of semiconductor devices include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 1A-1D, 2A, 2B, and 3 through 6.

Certain semiconductor devices, e.g., a memory device, may include an area with an array of memory cells (which may also be referred to as an array, a memory array, an array region, an array portion, or the like) and another area with peripheral circuitry (which may also be referred to as a periphery, a peripheral region, a peripheral portion, or the like). The array of memory cells may include various types of memory cells, such as dynamic random-access memory (DRAM) cells, phase change memory (PCM) cells, flash memory cells (e.g., NAND cells, NOR cells), among others. The peripheral circuitry can be configured to perform various functions for the semiconductor device, including accessing the memory cells of the array. In some cases, the peripheral region may be referred to as a CMOS region (CMOS, CMOS portion, CMOS area, etc.) in view of complementary-metal-oxide-semiconductor (CMOS) transistors included in the peripheral circuitry. Additionally, or alternatively, the peripheral region may be referred to as a logic region owing to the nature of digital logic functions that the peripheral circuitry performs. As such, the memory device may be regarded to have an array region and a CMOS region (or a peripheral/logic region), among others.

In general, a die size of a memory device may be primarily determined by the area of the array region and the area of the CMOS region. Accordingly, research and development efforts have been focused on reducing both areas—e.g., vertically stacking memory cells (e.g., as in the 3-dimensional (3D) NAND memory technology) to reduce the area of the array region, or CMOS transistor scaling to reduce the area of the CMOS region. Process steps associated with fabricating an array of memory cells, however, may include disparate characteristics than those used for fabricating CMOS circuitry. For example, temperatures of certain CMOS process steps may be higher than those used in memory array process steps (and may be higher than a memory array can withstand without damage). Additionally, or alternatively, defect mechanisms associated with the array of memory cells tend to be different from those associated with the CMOS circuitry.

As such, example embodiments of the present technology involve fabricating the CMOS region and the array region of the memory device as two separate semiconductor devices (or semiconductor dies) to optimize the fabrication processes of the CMOS circuitry and the memory cells independently of each other. Moreover, the two separate dies (e.g., an array die and a CMOS die) may be vertically combined (e.g., stacked to form a pair of semiconductor dies) such that the two (or more) separate dies, in combination, may function as a single device (e.g., one memory device). In some embodiments, front (e.g., active) surfaces of the two semiconductor dies can be arranged to face each other to form the pair such that a distance between the CMOS circuitry and the memory cells may be reduced. Moreover, the front surfaces of the two semiconductor dies may be conjoined to couple the CMOS circuitry with the memory cells of the array through conductive components (e.g., copper (Cu), Cu-containing alloy) at the interface between the array die and the CMOS die. The stack of semiconductor dies (i.e., a semiconductor die stack) may provide a smaller footprint and an improved performance (e.g., a reduced delay time owing to the reduced distance between the CMOS circuitry and the memory cells), when compared to a memory device having the CMOS circuitry and the memory cells laterally distributed.

Further, one of the dies (e.g., the array die) of the stack may be arranged to extend past other die(s) (e.g., the CMOS die) to create a porch (e.g., an extended portion of the array device, uncovered by the CMOS device), where bond pads of the memory device (i.e., the semiconductor die stack) can be located. Such an arrangement creating the porch provides a gap (or a vertical space) between successive semiconductor die stacks disposed on top of another (e.g., a stack of semiconductor die stacks). The gap, in turn, may facilitate bond wires making connections to the bond pads of the memory device located in the porch, to couple the bond pads with substrate bond pads of a support substrate that carries the stack of the semiconductor die stacks. In other words, one of the semiconductor dies of the stack (e.g., the CMOS die) can be configured to provide a space (e.g., the gap) to make wire bond connections to each semiconductor die stack in the stack. In this manner, when the semiconductor die stacks are stacked on top of and in-line with each other, wire bonds to each semiconductor die stack of the stack can be formed without increasing overall footprint of the stack (e.g., avoiding the shingle stacking configuration). Moreover, the wire bonding to individual semiconductor die stacks (e.g., individual memory devices) can provide a lower-cost alternative when compared to forming through-substrate vias (TSVs, which may also be referred to as through-silicon vias) for individual memory devices for stacking them on top of and in-line with each other.

As used herein, the terms "front," "back," "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements. Moreover, although in the example embodiments herein, semiconductor die stacks with two dies (e.g., semiconductor die pairs) are used to illustrate clearly the overall features and the principles of the present technology, the present technology is not limited thereto. For example, in some embodiments, a semiconductor die stack could include a single larger die carrying two or more smaller ones. Additionally, or alternatively, one or more smaller ones carried by the single larger die may include a stack of dies.

FIG. 1A is an example schematic cross-sectional view of a semiconductor device 101 with a front side 102 and a back side 103. The semiconductor device 101 may include a substrate 104, an array region 105, and a CMOS (peripheral or logic) region 106. The array region 105 may include an array of memory cells 108 (DRAM cells, 3D NAND cells, NOR cell, or the like). The CMOS region 106 may include CMOS circuitry 113 (command and/or address decoders, column decoders, row decoders, sense amplifiers, or the like) configured to access the array of memory cells 108 (or a memory array 108).

The cross-sectional view of the semiconductor device 101 illustrates an issue related to positioning the array region 105 and the CMOS region 106 on a coplanar surface (e.g., the front side 102 of the semiconductor device 101). For example, signals propagating between the array region 105 and the CMOS region 106 (e.g., voltage and/or current traveling different distances between the array of memory cells 108 and the CMOS circuitry 113) may exhibit different delays for the semiconductor device 101 to handle. In this regard, the array region 105 includes near cells 109a (e.g., one or more memory cells located proximate to the CMOS region 106) and far cells 109b (e.g., one or more memory cells located relatively far from the CMOS region 106). Further, the CMOS region 106 includes near CMOS-components 114a (e.g., row decoders located proximate to the array region 105) and far CMOS-components 114b (e.g., row decoders located relatively far from the array region 105). The worst-case delay in the signal propagation may be between the far cells 109b and the far CMOS-components 114b while the best-case delay may be between the near cells 109a and the near CMOS-components 114a. Various schemes may be devised to reduce a range in the signal propagation delays, such as coupling the near-CMOS component 114a with the far cells 109b and the far-CMOS component 114b with the near cells 109a, partitioning the array region 105 to two or more sub-regions and/or partitioning the CMOS region 106 to two or more sub-regions such that the sub-regions of the array region 105 and the CMOS region 106 may be interspersed, among others.

Figure 1B:
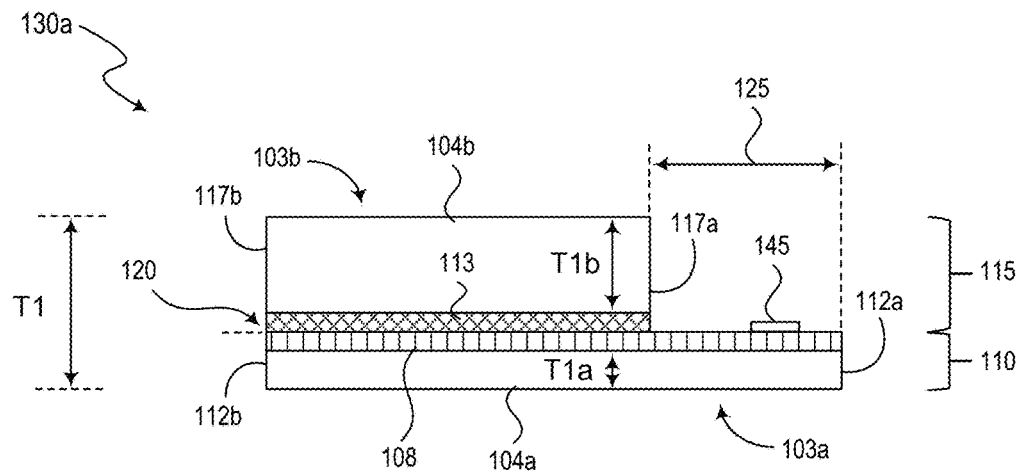
FIGS. 1B-1D are cross-sectional diagrams of semiconductor die pairs and a semiconductor die assembly in accordance with embodiments of the present technology.

FIG. 1B is an example schematic cross-sectional view of a semiconductor die pair 130a (which may also be referred to as a semiconductor die stack) in accordance with an embodiment of the present technology. The semiconductor die pair 130a includes an array die 110 (with the array of memory cells 108 on a front side thereof) and a CMOS die 115 (with the CMOS circuitry 113 on a front side thereof) arranged on top of the array die 110, where front sides of the array die 110 and the CMOS die 115 face each other at an interface 120. Further, the front surfaces of the CMOS die 115 and the array die 110 may be conjoined at the interface 120. The array die 110 and the CMOS die 115 include substrates 104a and 104b, respectively. In some embodiments, a thickness of the substrate 104a of the array die 110 may have been reduced when compared to a thickness of the substrate 104b—e.g., a portion of the substrate 104a has been removed from a back side 103a of the array die 110, by using grinding, polishing, etching, or other suitable process steps. As a result, the substrate 104a of the array die 110 includes a first thickness (T1a) that is less than a second thickness (T1b) of the substrate 104b of the CMOS die 115, which may be approximately same as a thickness of the wafer substrate including the CMOS die 115, in some embodiments.

In some cases, the semiconductor die pair 130a may be regarded as the semiconductor device 101 separated into two pieces (one piece corresponding to the array die 110 and another piece corresponding to the CMOS die 115) and coupled together, face to face (the array of memory cells 108 facing the CMOS circuitry 113)—e.g., a back side 103a of the array die 110 and a back side 103b of the CMOS die 115 each forming outer surfaces of the semiconductor die pair 130a. As such, the array die 110 may not include circuitry accessing the array of memory cell 108 because the CMOS die 115 includes the CMOS circuitry 113 configured to access the array of memory cells 108. In this manner, the array die 110 and the CMOS die 115, in combination, may function as a fully functional semiconductor device—e.g., the semiconductor device 101 having the array region 105 and the CMOS region 106. Further, the array die 110 may include a first footprint greater than a second footprint of the CMOS die 115.

Figure 2A:
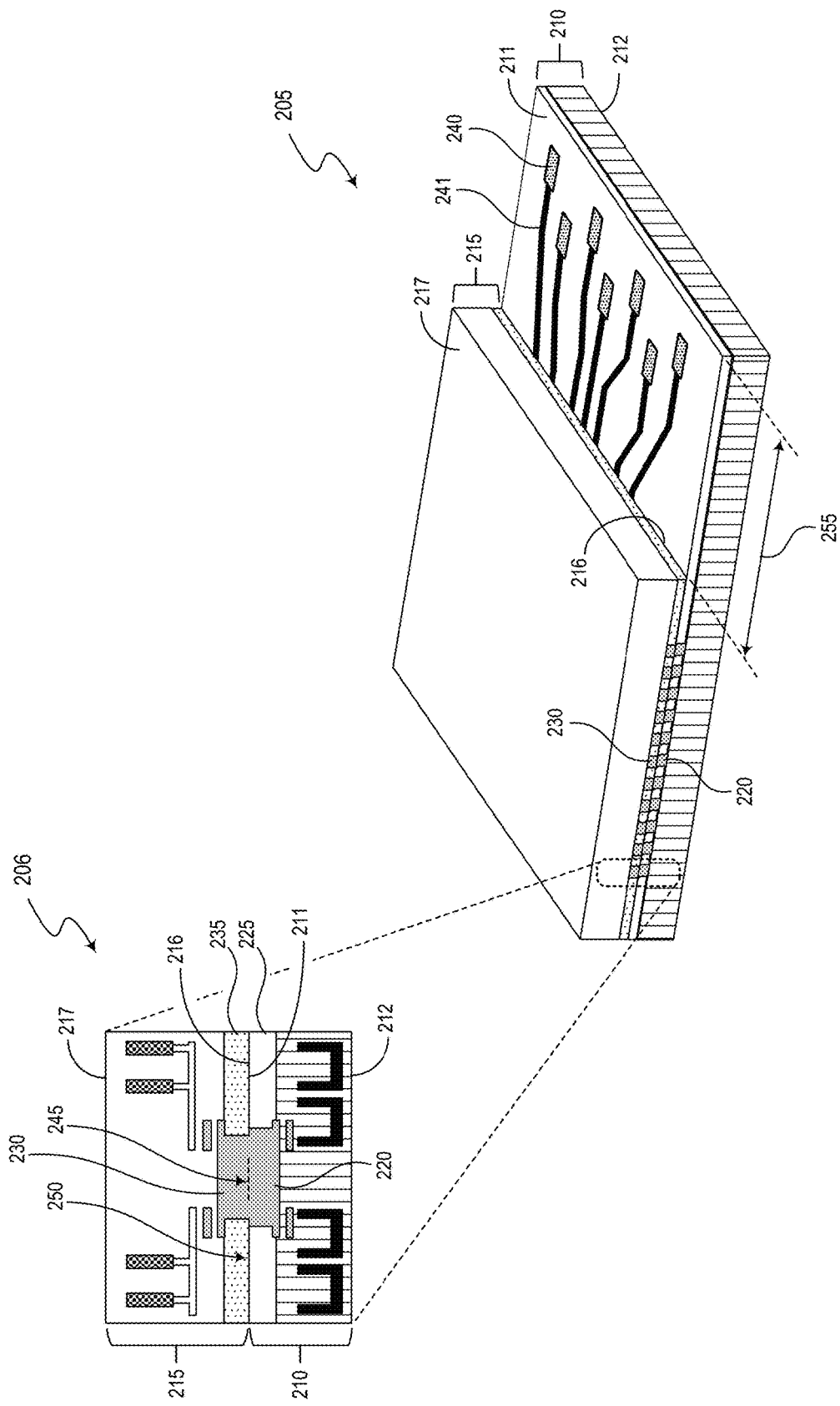
FIGS. 2A and 2B are three-dimensional diagrams of a semiconductor die stack and a semiconductor die assembly in accordance with embodiments of the present technology.

The array die 110 may include one or more first conductive components formed on the front side of the array die 110—e.g., conductive components 220 surrounded by a first dielectric material 225 as depicted in FIG. 2A. In some embodiments, the first conductive components may include copper (Cu) and/or Cu-alloy. The first conductive components may be coupled with the array of memory cells 108. The layer including the first dielectric material 225 of the array die 110 may also include conductive traces to distribute (route, direct) electrical signals between the array of memory cells 108 and the first conductive components. Similarly, the CMOS die 115 may include one or more second conductive components formed on the front side of the CMOS die 115—e.g., conductive components 230 surrounded by a second dielectric material 235 as depicted in FIG. 2A. In some embodiments, the second conductive components may include copper and/or Cu-alloy. The second conductive components may be coupled with the CMOS circuitry 113. The layer including the second dielectric material 235 of the CMOS die 115 may also include conductive traces to distribute (route, direct) electrical signals between the CMOS circuitry and the second conductive components. Further, the CMOS die 115 may be arranged over the array die 110 such that each of the second conductive components can be coupled with a corresponding one of the first conductive components. In this manner, the CMOS circuitry 113 may access the array of memory cells 108 through the second conductive components coupled with (e.g., directly bonded to) the first conductive components.

In some embodiments, each of the first conductive components of the array die 110 may be directly bonded to a corresponding one of the second conductive components of the CMOS die 115 at the interface 120. In addition, the first dielectric material may be directly bonded to the second dielectric material at the interface 120. Such a bonding scheme (e.g., a bonding interface including two or more materials (copper, nitride and/or oxide) directly bonded together) may be referred to as a combinational bonding scheme. Further, the front surfaces of the CMOS die 115 and the array die 110 may be regarded as conjoined at the interface 120. In other embodiments, each of the first conductive components may be connected to a corresponding one of the second conductive components through a conductive pillar, a conductive bump, a conductive ball, or the like.

The semiconductor die pair 130a includes an edge 112a of the array die 110 that extends past a corresponding edge 117a of the CMOS die 115 such that a portion 125 of the front side of the array die 110 is exposed (e.g., uncovered by the CMOS die 115). Also, the portion 125 of the array die 110 may include one or more bond pads 145 of the semiconductor die pair 130a. Moreover, the semiconductor die pair 130a includes an edge 112b of the array die 110 that is in line with (e.g., flush with) a corresponding edge 117b of the CMOS die 115. In some embodiments, an area of the portion 125 of the array die 110 may be based on a quantity of bond pads 145 of the semiconductor die pair 130a—e.g., to accommodate the quantity of bond pads 145 within the area of the portion 125. In other embodiments, the CMOS die 115 may be arranged to couple with the array die 110, away from two or more edges of the array die 110 such that two or more portions of the array die 110 may be uncovered by the CMOS die 115. Such multiple uncovered portions 125 of the array die 110 may be advantageous to accommodate a large quantity of bond pads 145 of the semiconductor die pair 130a as described in more detail with reference to FIG. 3.

As depicted in FIG. 1B, the array die 110 and the CMOS die 115 include a substrate 104a and a substrate 104b, respectively. In some cases, the substrate 104 (e.g., the substrate 104a, the substrate 104b, or both) may be polished from back sides to reduce an overall thickness (denoted as "T1" in FIG. 1B) of the semiconductor die pair 130a. The substrate 104b of the CMOS die 115 may provide a space (gap) with respect to another semiconductor die (or semiconductor die stack) stacked on top of the CMOS die 115, which may facilitate forming of bond wires, as described in more details with reference to FIG. 1D. For example, the CMOS die 115 may include a thickness greater than a height to which bond wires attached to the bond pads 145 rise above the front side of the array die 110.

Figure 1C:
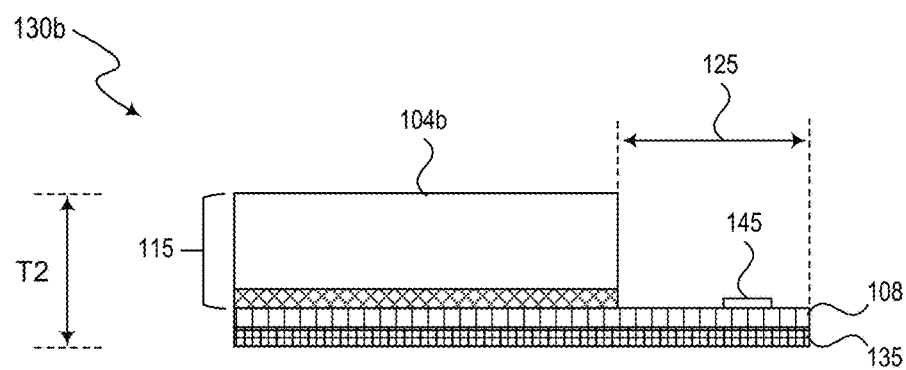

FIG. 1C is an example schematic cross-sectional view of a semiconductor die pair 130b (which may also be referred to as a semiconductor die stack) in accordance with an embodiment of the present technology. The semiconductor die pair 130b may be an example of or include aspects of the semiconductor die pair 130a. The semiconductor die pair 130b may correspond to the semiconductor die pair 130a with the substrate 104a of the array die 110 removed—i.e., the array die 110 may be exclusive of a substrate. As such, the semiconductor die pair 130b includes the CMOS die 115 and the array of memory cells 108. In some embodiments, a support structure 135 may be bonded to (or otherwise attached to) the array of memory cells 108 to provide mechanical support, in lieu of the substrate 104a. As a result of removing the substrate 104a (or replacing the substrate 104a with the support structure 135), an overall thickness (denoted as "T2" in FIG. 1C) of the semiconductor die pair 130b may be less than the thickness (T1) of the semiconductor die pair 130a. Such a reduction in the thickness of the semiconductor die pair 130b may be advantageous if two or more semiconductor die pairs 130b are stacked on top of another to reduce a height of the stack (hence a height of a package including the stack).

Although in the foregoing examples, a memory die (e.g., a first semiconductor die) and a CMOS die (e.g., a second semiconductor die) are described and illustrated to form the semiconductor die pair to function as a single memory device, the present technology is not limited thereto. In other words, the present technology may be applied to any semiconductor devices having two or more functional levels and/or blocks that may be separated into corresponding semiconductor dies that each include one or more functional levels and/or blocks. For example, a CPU die may include an arithmetic logic region and a cache memory region, among other regions supporting various functions of the CPU. The present technology may facilitate separating the cache memory region into a separate semiconductor die (e.g., a cache memory die), and then combining the cache memory die with an arithmetic logic die (e.g., the CPU die less the cache memory region) such that the cache memory die and the arithmetic logic die can be conjoined together to form a semiconductor die stack that operates as a single CPU. In other examples, a GPU may be partitioned into two portions—e.g., a first portion including graphics and compute array and a second portion including various peripheral circuitry, such as interface blocks, controlling circuit blocks, etc. As such, a first semiconductor die (including the graphics and compute array) and a second semiconductor dies (including various peripheral circuitry) may be generated separately such that the first and second semiconductor dies can be combined (e.g., stacked on top of another, face-to-face) to form a semiconductor die stack that operates as a single GPU.

Further, although in the foregoing examples, the memory die 110 is described and illustrated to be greater in size than the CMOS die 115 (e.g., the memory die 110 having a footprint greater than the footprint of the CMOS die 115) such that the memory die 110 can "carry" the CMOS die 115, and includes the bond pads of the semiconductor die pair 130, the present technology is not limited thereto. For example, the CMOS die may be greater than the array die—e.g., when the semiconductor device 101 is a controller with an embedded memory occupying a relatively small area of the semiconductor device 101. Accordingly, the CMOS die (including various functional blocks of the controller) may be greater in size than the memory die (including the embedded memory) such that the CMOS die may carry the memory die and include the bond pads for the semiconductor die pair.

Figure 1D:
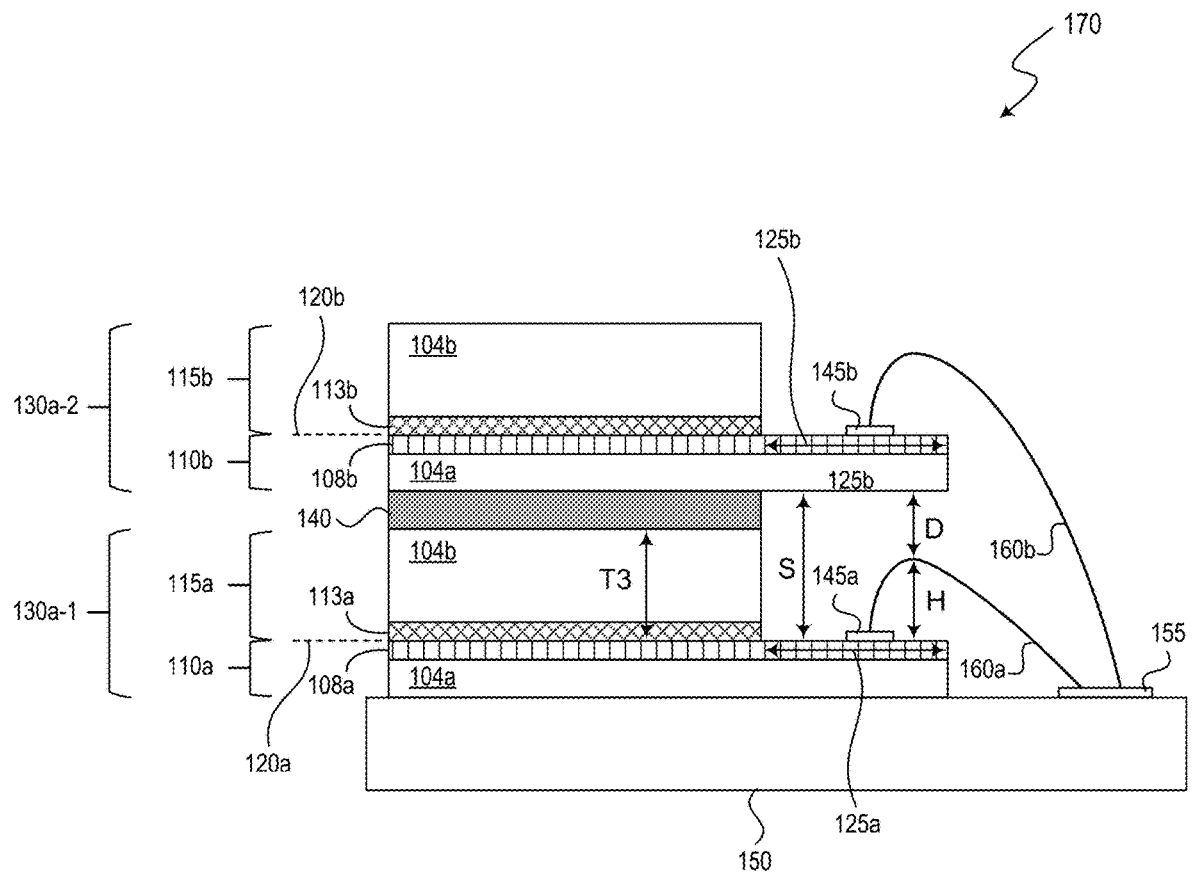

FIG. 1D is an example schematic cross-sectional view of a semiconductor die assembly 170 including a stack of semiconductor die pairs (which may also be referred to as semiconductor die stacks) in accordance with an embodiment of the present technology. The semiconductor die assembly 170 includes two semiconductor die pairs (e.g., semiconductor die pair 130a-1, semiconductor die pair 130a-2) in the stack. The semiconductor die pairs 130a-1 and 130a-2 may be examples of or include aspects of the semiconductor die pair 130a described with reference to FIG. 1B. The semiconductor die assembly 170 further includes a support substrate 150, to which the stack of semiconductor die pairs is attached. In some embodiments, an adhesive layer may be added between two adjacent semiconductor die pairs to form the stack—e.g., the adhesive layer 140 between the semiconductor die pair 130a-1 and semiconductor die pair 130a-2. The support substrate 150 includes one or more substrate bond pads (e.g., substrate bond pads 155, one of which is shown). Moreover, the semiconductor die assembly 170 includes bond wires (e.g., bond wires 160a and 160b) that couple individual bond pads of the semiconductor die pairs (e.g., the bond pads 145a of the semiconductor die pair 130a-1, the bond pads 145b of the semiconductor die pair 130a-2) to corresponding substrate bond pads 155.

The stack of semiconductor die pairs may be configured to include a space (denoted as "S" in FIG. 1D) such that bond wires (e.g., bond wire 160a) can make connections to the bond pads of the semiconductor die pairs (e.g., bond pad 145a of the semiconductor die pair 130a-1) without having to interfere with a semiconductor die positioned above (e.g., the array die 110b of the semiconductor die pair 130a-2). In some embodiments, the space is configured to allow a wire-bonding head to reach the bond pads (e.g., bond pad 145a) without touching the back side of the array die 110b of the semiconductor die pair 130a-2. By way of example, the highest portion of the bond wire 160a is separate from the back side of the array die 110b of the semiconductor die pair 130a-2 by a distance D. In some cases, the CMOS die 115 may include a thickness (denoted as "T3") greater than a height (denoted as "H") to which bond wires 160 attached to the bond pads 145 (e.g., bond pad 145a) rise above the front side of the array die 110. In some cases, the space S may include a thickness of the adhesive layer 140, in addition to the thickness (e.g., T3) of the CMOS die 115a. So long as the space S (a sum of T3 and a thickness of the adhesive layer 140) is greater than H, electrical connections to each semiconductor die pair (e.g., multiple semiconductor die pairs in a stack) can be made with a wire bonding technique, which may provide a low-cost alternative to TSVs implemented to transmit signals in a vertically stacked semiconductor devices.

Although the foregoing example depicted in FIG. 1D includes two (2) semiconductor die pairs 130a, in other embodiments, the stack of semiconductor die pairs may include a greater quantity than two (e.g., four (4), six (6), eight (8), twelve (12), or even more). Moreover, although the stack of semiconductor die pairs in FIG. 1D illustrates two (2) semiconductor die pairs 130a stacked in line (e.g., to minimize the footprint of the stack), in other embodiments, the stack of semiconductor die pairs may be formed in a shingled pattern (or stair-steps pattern). Also, in some embodiments, one or more semiconductor die pairs 130 may be rotated by 90-degrees, 180-degrees, or 270-degrees with respect to each other such that the bond pads of the semiconductor die pairs 130a may be accessed more easily (e.g., by the bond wires).

In some embodiments, a semiconductor die assembly may include a first pair of dies (e.g., the semiconductor die pair 130a-1) including a first die (e.g., the CMOS die 115a) attached to a second die (e.g., the array die 110a), where front surfaces of the first and second dies are conjoined (e.g., conjoined at the interface 120a), and the front surface of the second die includes a first extended portion (e.g., the extended portion 125a) uncovered by the first die, the first extended portion including a first set of bond pads (e.g., bond pads 145a, one of which is shown in FIG. 1D). Further, the semiconductor die assembly may include a second pair of dies (e.g., the semiconductor die pair 130a-2) carried by the first pair of semiconductor dies, the second pair including a third die (e.g., the CMOS die 115b) attached to a fourth die (e.g., the array die 110b), where front surfaces of the third and fourth dies are conjoined (e.g., conjoined at the interface 120b), and the front surface of the fourth die includes a second extended portion (e.g., the extended portion 125b) uncovered by the third die, the second extended portion including a second set of bond pads (e.g., bond pads 145b, one of which is shown in FIG. 1D).

In some embodiments, the semiconductor die assembly may include a support substrate (e.g., support substrate 150), to which a back side of the second die (e.g., the array die 110a) of the first pair is attached, the support substrate including a plurality of substrate bond pads (e.g., substrate bond pads 155, one of which is shown in FIG. 1D). Further, the semiconductor die assembly may include a plurality of first bond wires (e.g., bond wires 160a, one of which is shown in FIG. 1D) coupling individual bond pads of the first set (e.g., bond pad 145a) with corresponding substrate bond pads of the plurality (e.g., substrate bond pads 155), and a plurality of second bond wires (e.g., bond wires 160b, one of which is shown in FIG. 1D) coupling individual bond pads of the second set (e.g., bond pad 145b) with corresponding substrate bond pads of the plurality (e.g., substrate bond pads 155).

In some embodiments, the second die includes a first array of memory cells (e.g., the array of memory cells 108a), exclusive of circuitry configured to access the first array of memory cells, and the first die includes first peripheral circuitry (e.g., the CMOS circuitry 113a) configured to access a first array of memory cells of the second die. In some embodiments, the front surfaces of the first and second dies each include a plurality of conductive components (e.g., conductive components 220 and 230 depicted in FIG. 2A), and individual conductive components of the first die are conjoined with corresponding conductive components of the second die. Further, the peripheral circuitry of the first die (e.g., the CMOS circuitry 113a) may be configured to access the array of memory cells of the second die (e.g., the array of memory cells 108a) through one or more conjoined conductive components of the plurality.

Similarly, the fourth die may include a second array of memory cells (e.g., the array of memory cells 108b), exclusive of circuitry configured to access the second array of memory cells, and the third die may include second peripheral circuitry (e.g., the CMOS circuitry 113b) configured to access a second array of memory cells of the fourth die. Further, the peripheral circuitry of the third die (e.g., the CMOS circuitry 113b) may be configured to access the array of memory cells of the fourth die (e.g., the array of memory cells 108b) through one or more conjoined conductive components (e.g., conductive components 220 and 230 depicted in FIG. 2A) included in front surfaces of the third and fourth dies.

In some embodiments, a footprint of the second pair overlaps the first set of bond pads (e.g., bond pad 145a), and a thickness of the first die (e.g., CMOS die 115a) is configured to provide a gap for the plurality of first bond wires (e.g., bond wire 160a) to be separate from a back side of the fourth die (e.g., array die 110b) by a distance. Further, the gap may include a thickness of an adhesive (e.g., adhesive layer 140) located between the back side of the fourth die and a back side of the first die. In some embodiments, the gap is configured to allow a wire-bonding head to reach the bond pads of the first set (e.g., bond pad 145a) without touching the back side of the fourth die. Accordingly, a stack of semiconductor die pairs 130a may be formed (e.g., the semiconductor die pair 130a-2 attached to the semiconductor die pair 130a-1) prior to forming bond wires that couples the bond pads of the first set to corresponding substrate bond pads of the plurality (e.g., substrate bond pads 155).

FIG. 2A is an example schematic three-dimensional view of a semiconductor die stack 205 including a first semiconductor die 210 and second semiconductor die 215. The semiconductor die stack 205 may be an example of the semiconductor die pair 130 (e.g., the semiconductor die pair 130a, the semiconductor die pair 130b) or include aspects of the semiconductor die pair 130 described with reference to FIGS. 1A through 1D. Further, the first semiconductor die 210 and the second semiconductor die 215 may be examples of or include aspects of the memory die 110 and the CMOS die 115, respectively. The first semiconductor die 210 includes a front surface (or a front side) 211 and a back surface (or a back side) 212. Similarly, the second semiconductor die 215 includes a front surface (or a front side) 216 and a back surface (or a back side) 217. The first semiconductor die 210 includes an extended portion 255 (e.g., the portion 125 described with reference to FIGS. 1A-1D) and a set of bond pads 240 (e.g., the bond pads 145 described with reference to FIGS. 1A-1D) in the extended portion 255.

In some embodiments, the first semiconductor die 210 may include an array of memory cells, exclusive of circuitry configured to access the array of memory cells. The second semiconductor die 215 may include CMOS circuitry configured to access the array of memory cells of the first semiconductor die 210—e.g., through one or more conductive components configured to couple the array of memory cells with the CMOS circuitry. In some embodiments, the first semiconductor die 210 includes one or more first conductive components 220 on the front side 211 of the first semiconductor die 210 (further details of the first conductive components 220 are illustrated in an enlarged schematic cross-sectional diagram 206), where the first conductive components 220 are coupled with the array of memory cells of the first semiconductor die 210. Also, the second semiconductor die 215 may include one or more second conductive components 230 on the front side 216 of the second semiconductor die 215 (further details of the second conductive components 230 are illustrated in the diagram 206), where the second conductive components 230 are coupled with the CMOS circuitry of the second semiconductor die 215. Moreover, the second semiconductor die 215 is arranged over the first semiconductor die 210 such that each of the second conductive components 230 is directly bonded to a corresponding one of the first conductive components 220.

Referring to the diagram 206, a first dielectric material 225 surrounding each of the first conductive components 220 may be directly bonded to a second dielectric material 235 surrounding each of the second conductive components 230, in some embodiments. Such a bonding configuration (e.g., an interface between the front side 211 of first semiconductor die 210 and the front side 216 of second semiconductor die 215 including a direct bonding interface 245 between the first and second conductive components 220 and 230, as well as a direct bonding interface 250 between the first and second dielectric materials 225 and 235) may be referred to as a combinational bonding configuration. In some embodiments, the first and second dielectric materials 225 and 235 may include additional conductive features (e.g., metallic components and traces, including copper, Cu-alloy, tungsten, aluminum, or the like) to distribute (e.g., route, direct) electrical signals from the array of memory cells and the CMOS circuitry to the first conductive components 220 and the second conductive components 230, respectively.

Further, an edge of the first semiconductor die 210 may extend past a corresponding edge of the second semiconductor die 215 such that a portion (e.g., the portion 255) of the front side 211 of the first semiconductor die 210 is exposed, where the portion includes the set of bond pads 240 (e.g., bond pads 145). The first semiconductor die 210 further includes conductive traces 241 connecting the bond pads 240 to the first conductive components 220 that are coupled with the second conductive components 230. In some embodiments, the CMOS circuitry of the second semiconductor die 215 may access the array of memory cells of the first semiconductor die 210 through the second conductive components 230 directly bonded to the first conductive components 220.

In some embodiments, the first semiconductor die 210 may be exclusive of a semiconductor substrate as described in the semiconductor die pair 130b with reference to FIG. 1C—i.e., the first semiconductor die may include an array of memory cells (e.g., array of memory cells 108), which may be attached to a support structure (e.g., support structure 135). In some embodiments, the second semiconductor die 215 includes a thickness greater than a height to which bond wires attached to the set of bond pads 240 rise above the front side 211 of the first semiconductor die 210. In some embodiments, the first semiconductor die 210 includes a first footprint greater than a second footprint of the second semiconductor die 215. In some embodiments, a back side 212 of the first semiconductor die 210 is attached to a support substrate (e.g., support substrate 150, support substrate 260 depicted in FIG. 2B) including a plurality of substrate bond pads (e.g., substrate bond pads 155). Further, a plurality of bond wires (e.g., bond wires 160) may couple individual bond pads 240 with corresponding substrate bond pads.

Figure 2B:
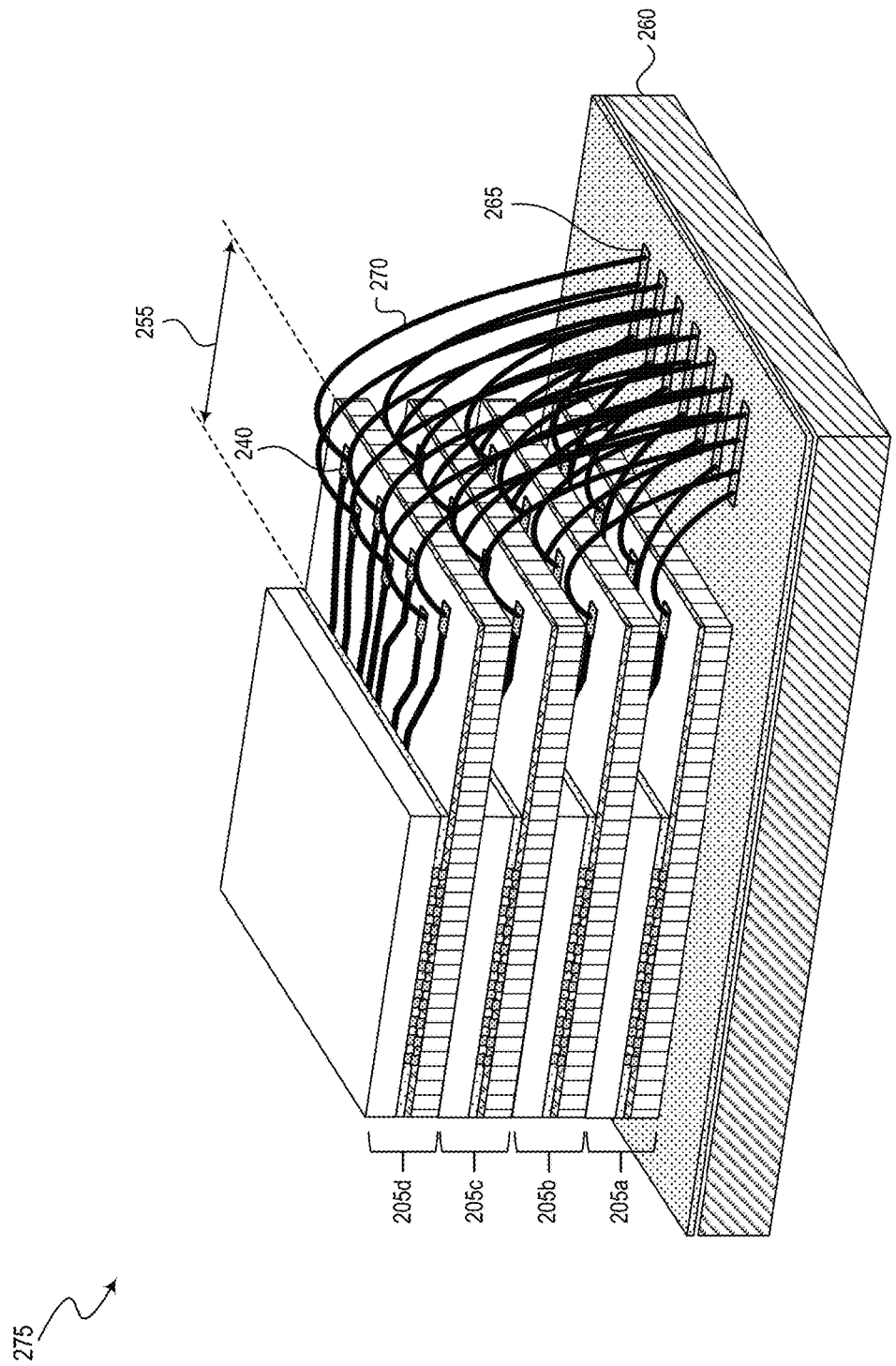

FIG. 2B is an example schematic three-dimensional view of a semiconductor die assembly 275 including a stack of semiconductor die stacks (e.g., semiconductor die pair 130, semiconductor die stack 205) attached to a support substrate 260 (e.g., support substrate 150). The semiconductor die assembly 275 may be an example of or include aspects of the semiconductor die assembly 170. The stack depicted in FIG. 2B includes four (4) semiconductor die stacks 205 (e.g., semiconductor die stacks 205a through 205d), but in other embodiments, the stack may include a less quantity of semiconductor die stacks (e.g., three (3), two (2)) or a greater quantity of semiconductor die stacks (e.g., six (6), twelve (12), or even greater). As described herein, the individual semiconductor die stack 205 including the array die and CMOS die stacked, face-to-face, may provide a smaller footprint and an improved performance for a memory device (e.g., when compared to a semiconductor device 101 described with reference to FIG. 1). Further, the semiconductor die stack 205 including the extended portion 255 with bond pads (e.g., bond pads 145, bond pads 240) may facilitate stacking two or more semiconductor die stacks 205 in-line to reduce the footprint of the stack (e.g., when compared to a stack with a shingled stacking pattern), as well as forming bond wires (e.g., bond wires 160, bond wires 270) to individual semiconductor die stacks 205 in the stack—e.g., coupling individual bond pads 240 with corresponding substrate bond pads 265.

Figure 3:
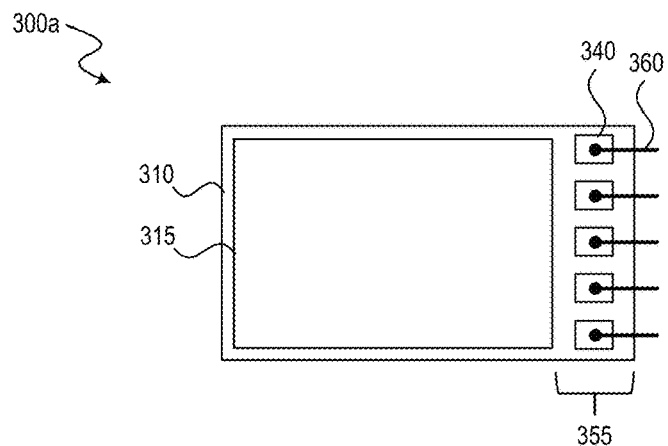
FIG. 3 illustrates various plan view diagrams of semiconductor die stacks in accordance with embodiments of the present technology.
Figure 3:
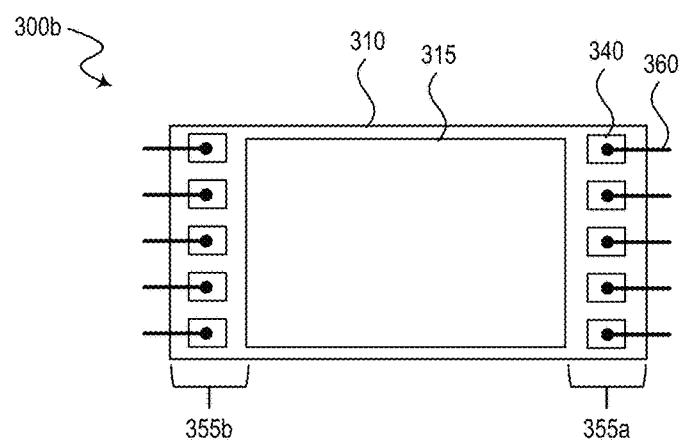
Figure 3:
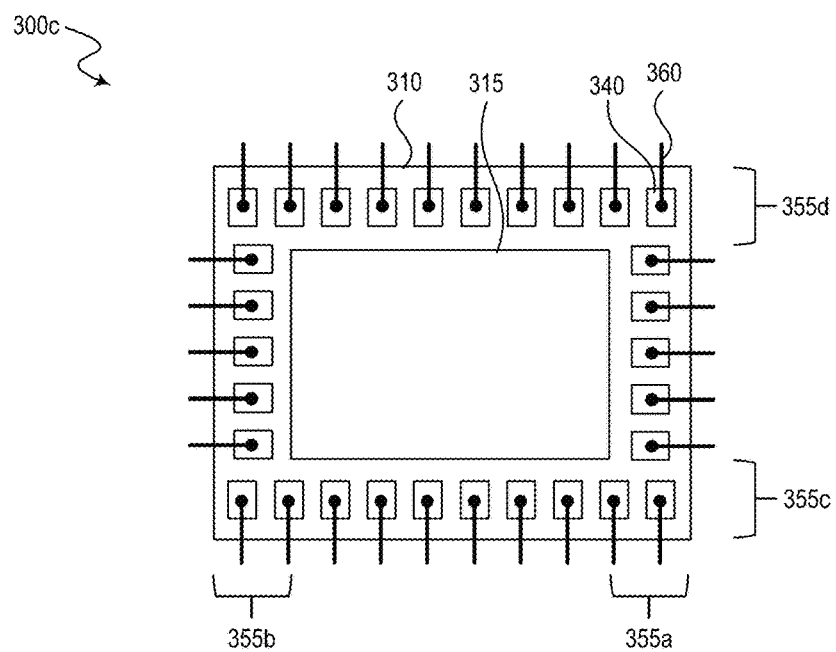

FIG. 3 illustrates various plan view diagrams 300 of semiconductor die stacks in accordance with embodiments of the present technology. Each diagram includes a first semiconductor die 310 (e.g., array die 110, first semiconductor die 210), a second semiconductor die 315 (e.g., CMOS die 115, second semiconductor die 215), one or more extended (or exposed) portions 355 (e.g., portion 125, portion 255), a set of bond pads 340 (e.g., bond pads 145, bond pads 240), and a set of bond wires 360 (bond wires 160, bond wires 270). The diagrams 300 depict various options to form the extended (exposed) portions in the semiconductor die stack based on several factors, such as die sizes of the first and second semiconductor dies, a quantity of bond pads of the semiconductor die stack, a footprint of the semiconductor die stack, shapes of the a first semiconductor die 310 and/or the second semiconductor die 315, among others.

For example, the diagram 300a may correspond to the stacking configuration of the semiconductor die pair 130 and/or the semiconductor die stack 205—e.g., creating a single extended portion 355. In some embodiments, the diagram 300c may be advantageous to form a semiconductor die stack if a quantity of bond pads is significantly greater than that of the semiconductor die stack depicted in the diagram 300a—e.g., creating four (4) extended portions 355a-d with an increased footprint of the semiconductor die stack. In yet another example, the diagram 300b may be advantageous to form a semiconductor die stack if a quantity of bond pads is moderately greater than that of the semiconductor die stack depicted in the diagram 300a—e.g., creating two (2) extended portions 355a and 355b.

Diagrams 300 provide various examples of the stacking configuration to form a semiconductor die stack for illustration purposes, and the present technology is not limited thereto. For example, the second semiconductor die 315 may be rotated (e.g., by 90-degrees) with respect to the first semiconductor die 310 to provide a wider area for the exposed portion 355—i.e., one or more edges of the second semiconductor die 315 may lie outside of corresponding edges of the first semiconductor die 310. In other words, the semiconductor die stack may have some parts of the second semiconductor die 315 overhanging beyond a boundary of the first semiconductor die 310. In some cases, such an arrangement may be based on trade-offs between a quantity of bond pads of the semiconductor die stack and a footprint (e.g., overall size of the semiconductor die stack), among others. Further, although the bond pads 340 are depicted in a single column (and/or row), the bond pads 340 may be arranged in multiple columns (and/or rows). In some cases, each column (or row) of the multiple columns (or rows) of bond pads may be shifted relative to each other to provide easier access of bond wires to the bond pads.

Figure 4:
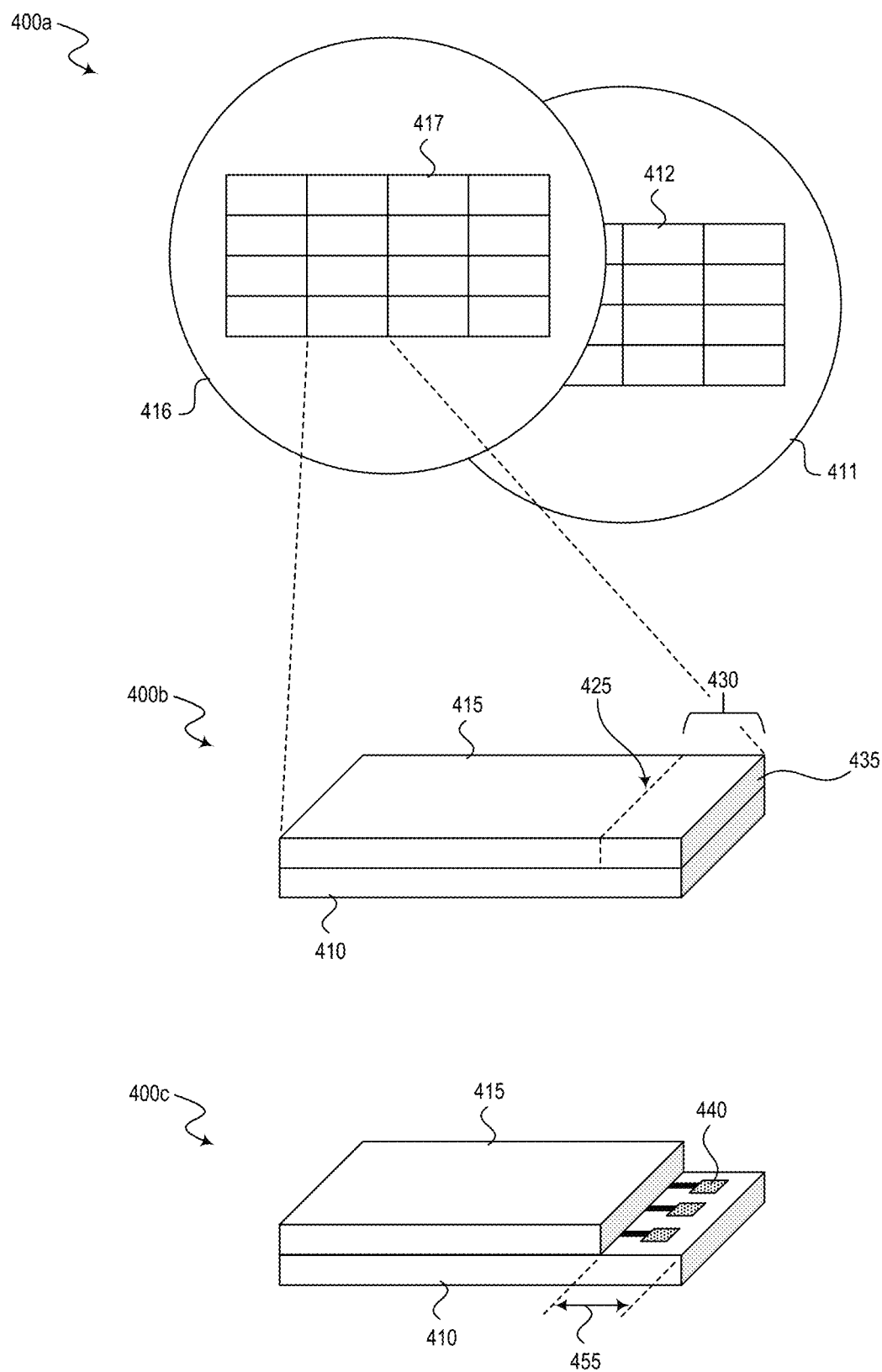
FIG. 4 illustrates example process steps of making semiconductor die stacks in accordance with embodiments of the present technology.

FIG. 4 illustrates diagrams 400a-c describing example process steps of making semiconductor die stacks in accordance with embodiments of the present technology. Diagram 400a shows a first semiconductor wafer 411 including a plurality of first die fields 412 on its front side and a second semiconductor wafer 416 including a plurality of second die fields 417 on its front side. In some embodiments, each of the first die fields 412 corresponds to a first die 410 (e.g., array die 110) that includes an array of memory cells (e.g., array of memory cells 108), exclusive of circuitry configured to access the array of memory cells. Further, each of the second die fields 417 may have the same area as each of the first die fields 412. Each of the second die fields 417 may correspond to a second die 415 (e.g., CMOS die 115) and a segment 435 (or a portion) of the second semiconductor wafer adjacent to the second die 415. In some embodiments, the second die 415 includes CMOS circuitry configured to access the array of memory cells of the first die 410. Further, each of the front surfaces of the first and second dies may include a plurality of conductive components—e.g., the first conductive components 220, the second conductive components 230, respectively.

In some embodiments, the second semiconductor wafer 416 may be flipped and brought over the first semiconductor wafer 411 such that front sides of the first and second wafers 411 and 416 may face each other. Subsequently, the first semiconductor wafer 411 including the first die 410 may be arranged over the second semiconductor wafer 416 including the second die 415 (or the second semiconductor wafer 416 including the second die 415 may be arranged over the first semiconductor wafer 411 including the first die 410) such that each of the conductive components of the first die 410 is aligned to the corresponding one of the conductive components of the second die 415. Subsequently, the first semiconductor wafer 411 may be bonded to the second semiconductor wafer 416 to directly bond each of the conductive components of the first die 410 to the corresponding one of the conductive components of the second die 415. Additionally, a first dielectric material surrounding each of the conductive components of the first die 410 may be directly bonded to a second dielectric material surrounding the corresponding one of the conductive components of the second die 415 (e.g., forming the combinational bonding configuration described with reference to FIG. 2A). The diagram 400b depicts a single die field after the bonding is complete, where the single die field includes the first die 410 bonded to the second die 415.

In some embodiments, the segment 435 of the second semiconductor wafer 416 may be removed, after bonding the first semiconductor wafer 411 and the semiconductor wafer 416, to expose a set of bond pads 440 (e.g., bond pads 145, bond pads 240, bond pads 340) of the first die 410. In other words, removing the segment 435 creates an extended portion 455 (e.g., extended portion 125, extended portion 255, extended portion 355) of the first die 410, where the set of bond pads 440 is located as depicted in the diagram 400c. In some embodiments, removing the segment 435 may include severing the segment 435 from the second die 415 by using a dicing process—e.g., separating the segment 435 from the second die 415 by dicing through a border 425 between the second die 415 and the segment 435, in conjunction with utilizing other dicing lanes configured to singulate individual die fields 412 and 417 of the first and second semiconductor wafers 411 and 416, respectively. Thereafter, the separated segment 435 may be removed from the second semiconductor wafer 416 (bonded to the first wafer 411), e.g., by using a cleaning process. In this manner, the first and second dies 410 and 415 are conjoined at the wafer level to form a semiconductor die stack, where a front surface of the first die 410 is in direct contact with a front surface of the second die 415, and where the front surface of the first die 410 includes a first extended portion 455 uncovered by the second die 415. The extended portion includes set of bond pads 440.

In some embodiments, removing the segment 435 may include severing the segment 435 (or otherwise removing or detaching the segment 435) from the second die 415 by using an etch process. In some cases, a photolithography process may cover the second die 415 with a photoresist while exposing a section 430 corresponding to the segment 435. Subsequently, the etch process can remove the segment 435 uncovered by the photoresist. In other cases, a photolithography process may expose sections of the second semiconductor wafer 416 including the border 425. Subsequently, the etch process may separate the segment 435 from the second die 415 by creating a trench, where a width of the trench includes the border 425 and a depth of the trench approximately corresponds to a thickness of the second semiconductor wafer 416. Thereafter, a cleaning process may be used to remove the separated segment 435—in conjunction with utilizing other dicing lanes configured to singulate individual die fields 412 and 417 of the first and second semiconductor wafers 411 and 416, respectively.

In other embodiments, individual second die fields 417 of the second semiconductor wafer 416 may correspond to the second die 415—e.g., without the segment 435 adjacent to the second die 415. Hence, an area of the second die field 417 may be less than that of the first die field 412 that corresponds to the first die 410. Individual first die 410 may be singulated from the first semiconductor wafer 411, and individual second die 415 may be singulated from the second semiconductor wafer 416. Thereafter, the second die 415 may be arranged over the first die 410 such that each of the conductive components of the first die 410 is aligned to the corresponding one of the conductive components of the second die 415. Further, the second die 415 may be bonded to the first die 410 to directly bond each of the conductive components of the first die 410 to the corresponding one of the conductive components of the second die 415 to form a semiconductor die stack, as shown in the diagram 400c.

Figure 5:
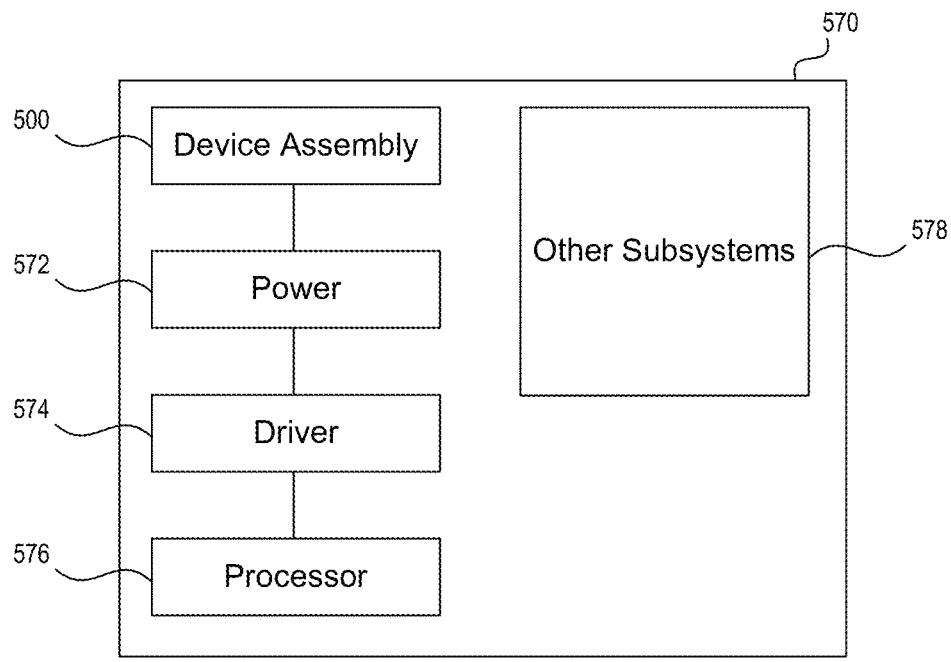
FIG. 5 is a block diagram schematically illustrating a system including a semiconductor device assembly configured in accordance with an embodiment of the present technology.

FIG. 5 is a block diagram schematically illustrating a system 570 including a semiconductor device assembly configured in accordance with an embodiment of the present technology. The semiconductor die stack (e.g., semiconductor die stacks 130a, 130b, 205) described with reference to FIGS. 1B, 1C, and 2A may be included in a semiconductor device assembly 500 (e.g., semiconductor device assembly 170, semiconductor device assembly 275) described with reference to FIGS. 1D and 2B. The semiconductor device assembly 500 can be incorporated into any of a myriad of larger and/or more complex systems, a representative example of which is the system 570 shown schematically in FIG. 5. The system 570 can include a semiconductor device assembly 500, a power source 572, a driver 574, a processor 576, and/or other subsystems or components 578.

The semiconductor die stack included in the semiconductor device assembly 500 can have features generally similar to the semiconductor die stack 205 including the array die and CMOS die stacked, face-to-face, including a smaller footprint and an improved performance (e.g., when compared to a semiconductor device 101) for the semiconductor device assembly 500. Further, the semiconductor die stack included in the semiconductor device assembly 500 may include the extended portion with bond pads (e.g., bond pads 145, bond pads 240) that can facilitate stacking two or more semiconductor die stacks in-line to reduce the footprint of the stack (e.g., when compared to a stack with a shingled stacking pattern), as well as forming bond wires to individual semiconductor die stacks in the stack (e.g., a lower-cost alternative to forming TSVs). The resulting system 570 can perform any of a wide variety of functions, such as memory storage, data processing, and/or other suitable functions. Accordingly, representative systems 570 can include, without limitation, hand-held devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

Figure 6:
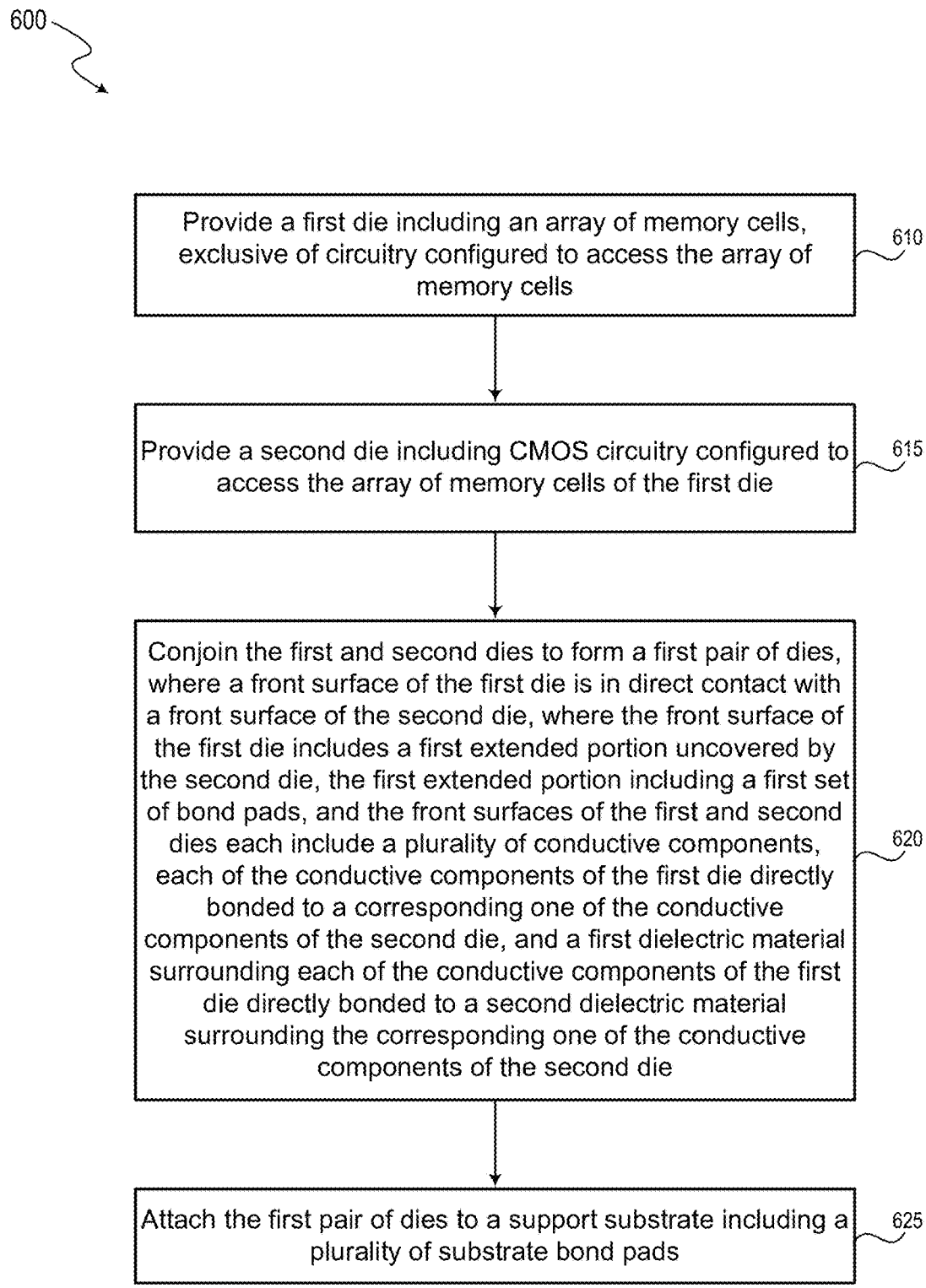
FIG. 6 is a flowchart of a method of making a semiconductor die pair in accordance with embodiments of the present technology.

FIG. 6 is a flowchart 600 of a method of making a semiconductor die pair in accordance with embodiments of the present technology. The flowchart 600 may include aspects of methods as described with reference to FIG. 4.

The method includes providing a first die including an array of memory cells, exclusive of circuitry configured to access the array of memory cells (box 610). The method further includes providing a second die including CMOS circuitry configured to access the array of memory cells of the first die (box 615). The method further includes conjoining the first and second dies to form a first pair of dies, where a front surface of the first die is in direct contact with a front surface of the second die, where the front surface of the first die includes a first extended portion uncovered by the second die, the first extended portion including a first set of bond pads, and the front surfaces of the first and second dies each include a plurality of conductive components, each of the conductive components of the first die directly bonded to a corresponding one of the conductive components of the second die, and a first dielectric material surrounding each of the conductive components of the first die directly bonded to a second dielectric material surrounding the corresponding one of the conductive components of the second die (box 620). The method further includes attaching the first pair of dies to a support substrate including a plurality of substrate bond pads (box 625).

In some embodiments, conjoining the first and second dies includes arranging a first semiconductor wafer including the first die over a second semiconductor wafer including the second die such that each of the conductive components of the first die is aligned to the corresponding one of the conductive components of the second die, bonding the first semiconductor wafer to the second semiconductor wafer to directly bond each of the conductive components of the first die to the corresponding one of the conductive components of the second die, and removing a portion of the second semiconductor wafer adjacent to the second die, the portion corresponding to the first extended portion of the first die, after bonding the first semiconductor wafer to the second semiconductor wafer. In some embodiments, removing the portion of the second semiconductor wafer includes severing the portion from the second die by using an etching process, a dicing process, or both, and removing the severed portion from the second semiconductor wafer. In some embodiments, conjoining the first and second dies includes arranging the second die over the first die such that each of the conductive components of the first die is aligned to the corresponding one of the conductive components of the second die, and bonding the second die to the first die to directly bond each of the conductive components of the first die to the corresponding one of the conductive components of the second die.

In some embodiments, the method may further include forming a plurality of first bond wires to couple individual bond pads of the first set with corresponding substrate bond pads of the plurality, and attaching, after forming the plurality of first bond wires, a second pair of dies to the first pair of dies, the second pair including a third die conjoined with a fourth die, where front surfaces of the third and fourth dies are in direct contact with each other, and the front surface of the third die includes a second extended portion uncovered by the fourth die, the second extended portion including a second set of bond pads, and the front surfaces of the third and fourth dies each include a plurality of conductive components, each of the conductive components of the third die directly bonded to a corresponding one of the conductive components of the fourth die, and a third dielectric material surrounding each of the conductive components of the third die directly bonded to a fourth dielectric material surrounding the corresponding one of the conductive components of the fourth die.

In some embodiments, the method may further include attaching a second pair of dies to the first pair of dies, the second pair including a third die conjoined with a fourth die, where front surfaces of the third and fourth dies are in direct contact with each other, and the front surface of the third die includes a second extended portion uncovered by the fourth die, the second extended portion including a second set of bond pads, and the front surfaces of the third and fourth dies each include a plurality of conductive components, each of the conductive components of the third die directly bonded to a corresponding one of the conductive components of the fourth die, and a third dielectric material surrounding each of the conductive components of the third die directly bonded to a fourth dielectric material surrounding the corresponding one of the conductive components of the fourth die. The method may further include forming, after attaching the second pair of dies to the first pair of dies, a plurality of first bond wires to couple individual bond pads of the first set with corresponding substrate bond pads of the plurality.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a first semiconductor die including an array of memory cells, exclusive of circuitry configured to access the array of memory cells; and
   a second semiconductor die including complementary metal-oxide-semiconductor (CMOS) circuitry configured to access the array of memory cells of the first semiconductor die, wherein:
   the first semiconductor die includes a first semiconductor substrate with a first thickness and the second semiconductor die includes a second semiconductor substrate with a second thickness different than the first thickness;
   the first semiconductor die includes one or more first conductive components and a set of bond pads on a front side of the first semiconductor die, the first conductive components coupled with the array of memory cells;
   the second semiconductor die includes one or more second conductive components on a front side of the second semiconductor die, the second conductive components coupled with the CMOS circuitry;
   the second semiconductor die is arranged over the first semiconductor die such that each of the second conductive components is directly bonded to a corresponding one of the first conductive components; and
   an edge of the first semiconductor die extends past a corresponding edge of the second semiconductor die such that a portion of the front side of the first semiconductor die is exposed, the portion including the set of bond pads.

2. The semiconductor die assembly of claim 1, wherein a first dielectric material surrounding each of the first conductive components is directly bonded to a second dielectric material surrounding each of the second conductive components.

3. The semiconductor die assembly of claim 1, wherein the CMOS circuitry accesses the array of memory cells through the second conductive components directly bonded to the first conductive components.

4. The semiconductor die assembly of claim 1, wherein the second semiconductor die includes a thickness greater than a height to which bond wires attached to the set of bond pads rise above the front side of the first semiconductor die.

5. The semiconductor die assembly of claim 1, wherein the first semiconductor die includes a first footprint greater than a second footprint of the second semiconductor die.

6. The semiconductor die assembly of claim 1, further comprising:
   a support substrate, to which a back side of the first semiconductor die is attached, the support substrate including a plurality of substrate bond pads; and
   a plurality of bond wires coupling individual bond pads of the set with corresponding substrate bond pads of the plurality.

7. The semiconductor die assembly of claim 1, wherein the second thickness is greater than the first thickness.

8. A semiconductor die assembly, comprising:
   a first pair of dies including a first die attached to a second die, wherein a front surface of the first die and a front surface of the second dies are conjoined, and the front surface of the second die includes a first extended portion uncovered by the first die, the first extended portion including a first set of bond pads, and wherein the first die includes a first semiconductor substrate with a first thickness and the second die includes a second semiconductor substrate with a second thickness different than the first thickness;
   a second pair of dies carried by the first pair of dies, the second pair including a third die attached to a fourth die, wherein a front surface of the third die and a front surface of the fourth dies are conjoined, and the front surface of the fourth die includes a second extended portion uncovered by the third die, the second extended portion including a second set of bond pads;
   a support substrate, to which a back side of the second die of the first pair is attached, the support substrate including a plurality of substrate bond pads;
   a plurality of first bond wires coupling individual ones of the first set of bond pads with corresponding individual ones of the plurality of substrate bond pads; and
   a plurality of second bond wires coupling individual ones of the second set of bond pads with corresponding individual ones of the plurality of substrate bond pads.

9. The semiconductor die assembly of claim 8, wherein:
   the front surfaces of the first and second dies each includes a plurality of conductive components, and individual ones of the plurality of conductive components of the first die are conjoined with corresponding individual ones of the plurality of conductive components of the second die; and
   peripheral circuitry of the first die is configured to access an array of memory cells of the second die through one or more conjoined conductive components of the plurality.

10. The semiconductor die assembly of claim 8, wherein:
    the second die includes a first array of memory cells, exclusive of circuitry configured to access the first array of memory cells; and
    the fourth die includes a second array of memory cells, exclusive of circuitry configured to access the second array of memory cells.

11. The semiconductor die assembly of claim 8, wherein:
    the first die includes first peripheral circuitry configured to access a first array of memory cells of the second die; and
    the third die includes second peripheral circuitry configured to access a second array of memory cells of the fourth die.

12. The semiconductor die assembly of claim 8, wherein a footprint of the second pair overlaps the first set of bond pads, and a thickness of the first die is configured to provide a gap for the plurality of first bond wires to be separate from a back side of the fourth die by a distance.

13. The semiconductor die assembly of claim 12, wherein the gap includes a thickness of an adhesive located between the back side of the fourth die and a back side of the first die.

14. The semiconductor die assembly of claim 12, wherein the gap is configured to allow a wire-bonding head to reach the bond pads of the first set without touching the back side of the fourth die.

15. A method comprising:
   providing a first die including an array of memory cells, exclusive of circuitry configured to access the array of memory cells;
   providing a second die including complementary metal-oxide-semiconductor (CMOS) circuitry configured to access the array of memory cells of the first die, wherein the first die includes a first semiconductor substrate with a first thickness and the second die includes a second semiconductor substrate with a second thickness different than the first thickness;
   conjoining the first and second dies to form a first pair of dies, wherein:
      a front surface of the first die is in direct contact with a front surface of the second die, wherein the front surface of the first die includes a first extended portion uncovered by the second die, the first extended portion including a first set of bond pads; and
      the front surfaces of the first and second dies each includes a plurality of conductive components, each of the conductive components of the first die directly bonded to a corresponding one of the conductive components of the second die, and a first dielectric material surrounding each of the conductive components of the first die directly bonded to a second dielectric material surrounding the corresponding one of the conductive components of the second die; and
   attaching the first pair of dies to a support substrate including a plurality of substrate bond pads.

16. The method of claim 15, wherein conjoining the first and second dies includes:
   arranging a first semiconductor wafer including the first die over a second semiconductor wafer including the second die such that each of the conductive components of the first die is aligned to the corresponding one of the conductive components of the second die;
   bonding the first semiconductor wafer to the second semiconductor wafer to directly bond each of the conductive components of the first die to the corresponding one of the conductive components of the second die; and
   removing a portion of the second semiconductor wafer adjacent to the second die, the portion corresponding to the first extended portion of the first die, after bonding the first semiconductor wafer to the second semiconductor wafer.

17. The method of claim 16, wherein removing the portion of the second semiconductor wafer includes:
   severing the portion from the second die by using an etching process, a dicing process, or both; and
   removing the severed portion from the second semiconductor wafer.

18. The method of claim 15, wherein conjoining the first and second dies includes:
   arranging the second die over the first die such that each of the conductive components of the first die is aligned to the corresponding one of the conductive components of the second die; and
   bonding the second die to the first die to directly bond each of the conductive components of the first die to the corresponding one of the conductive components of the second die.

19. The method of claim 15, further comprising:
   forming a plurality of first bond wires to couple individual bond pads of the first set with corresponding substrate bond pads of the plurality; and
   attaching, after forming the plurality of first bond wires, a second pair of dies to the first pair of dies, the second pair including a third die conjoined with a fourth die, wherein:
      front surfaces of the third and fourth dies are in direct contact with each other, and the front surface of the third die includes a second extended portion uncovered by the fourth die, the second extended portion including a second set of bond pads; and
      the front surfaces of the third and fourth dies each includes a plurality of conductive components, each of the conductive components of the third die directly bonded to a corresponding one of the conductive components of the fourth die, and a third dielectric material surrounding each of the conductive components of the third die directly bonded to a fourth dielectric material surrounding the corresponding one of the conductive components of the fourth die.

20. The method of claim 15, further comprising:
   attaching a second pair of dies to the first pair of dies, the second pair including a third die conjoined with a fourth die, wherein:
      front surfaces of the third and fourth dies are in direct contact with each other, and the front surface of the third die includes a second extended portion uncovered by the fourth die, the second extended portion including a second set of bond pads; and
      the front surfaces of the third and fourth dies each includes a plurality of conductive components, each of the conductive components of the third die directly bonded to a corresponding one of the conductive components of the fourth die, and a third dielectric material surrounding each of the conductive components of the third die directly bonded to a fourth dielectric material surrounding the corresponding one of the conductive components of the fourth die; and
   forming, after attaching the second pair of dies to the first pair of dies, a plurality of first bond wires to couple individual bond pads of the first set with corresponding substrate bond pads of the plurality.

\* \* \* \* \*